(12) United States Patent
Wu et al.

(10) Patent No.: US 11,990,390 B2
(45) Date of Patent: May 21, 2024

(54) SEMICONDUCTOR STRUCTURE

(71) Applicant: CHANGXIN MEMORY TECHNOLOGIES, INC., Anhui (CN)

(72) Inventors: Ping-Heng Wu, Hefei (CN); Chih-Wei Chang, Hefei (CN); Hailin Wang, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 381 days.

(21) Appl. No.: 17/460,428

(22) Filed: Aug. 30, 2021

(65) Prior Publication Data
US 2022/0005747 A1 Jan. 6, 2022

Related U.S. Application Data

(63) Continuation of application No. PCT/CN2021/100748, filed on Jun. 17, 2021.

(30) Foreign Application Priority Data

Jul. 6, 2020 (CN) .......................... 202010641966.9

(51) Int. Cl.
*H01L 23/48* (2006.01)
*H01L 23/522* (2006.01)

(52) U.S. Cl.
CPC ........ *H01L 23/481* (2013.01); *H01L 23/5223* (2013.01); *H01L 23/5226* (2013.01)

(58) Field of Classification Search
CPC ....... H01L 23/00; H01L 23/528; H01L 23/48; H01L 23/552; H01L 23/481; H01L 23/5223; H01L 23/5226; H01L 23/5225; H01L 23/562

See application file for complete search history.

(56) References Cited

U.S. PATENT DOCUMENTS

| 8,227,902 | B2 | 7/2012 | Kuo |
| 8,981,532 | B2 | 3/2015 | Torii |
| 9,293,415 | B2 | 3/2016 | Kim et al. |
| 10,163,809 | B2 * | 12/2018 | Horng ................... H01L 23/552 |
| 10,199,315 | B2 | 2/2019 | Farooq et al. |
| 2009/0134500 | A1 * | 5/2009 | Kuo ........................ H01L 23/66 |
| | | | 257/659 |
| 2012/0261826 | A1 * | 10/2012 | Kuo .................. H01L 21/76898 |
| | | | 257/E21.597 |
| 2013/0134548 | A1 | 5/2013 | Torii |
| 2015/0340314 | A1 | 11/2015 | Kim et al. |

FOREIGN PATENT DOCUMENTS

| CN | 101447479 A | 6/2009 |
| CN | 103824758 A | 5/2014 |

OTHER PUBLICATIONS

International Search Report in the international application No. PCT/CN2021/100748, dated Aug. 30, 2021, 2 pgs.

* cited by examiner

*Primary Examiner* — Jonathan Han
(74) *Attorney, Agent, or Firm* — Cooper Legal Group, LLC

(57) ABSTRACT

A semiconductor structure is provided, including: a substrate and a dielectric layer arranged on the substrate; a conductive plug, wherein a first part of the conductive plug is arranged in the substrate, and a second part of the conductive plug is arranged in the dielectric layer; and an isolation ring structure at least surrounding the second part of the conductive plug.

12 Claims, 4 Drawing Sheets

SEMICONDUCTOR STRUCTURE

CROSS-REFERENCE TO RELATED APPLICATIONS

This application is a continuation application of International Patent Application No. PCT/CN2021/100748, filed on Jun. 17, 2021 and entitled "Semiconductor Structure", which claims priority to Chinese patent application No. 202010641966.9, filed on Jul. 6, 2020 and entitled "Semiconductor Structure". The contents of International Patent Application No. PCT/CN2021/100748 and Chinese Patent Application No. 202010641966.9 are hereby incorporated by reference in their entireties.

TECHNICAL FIELD

Embodiments of the disclosure relate to the field of a semiconductor, in particular to a semiconductor structure.

BACKGROUND

In the related art, in order to implement the integration and assembly of a chip in a Z-axis direction, the interconnection between chips is usually implemented through Through-Silicon Vias (TSV). Specifically, TSV is to form a through hole for connecting an upper side and a lower side of a wafer and fill conductive materials in the through hole so as to form an interconnecting structure. The conductive materials include different types of metal materials.

However, in an actual application process, the arrangement of the interconnecting structure will cause influence on an element arranged on a surface of a silicon wafer and an element arranged in a dielectric layer on the silicon wafer.

SUMMARY

Some embodiments of the disclosure provide a semiconductor structure, which is beneficial to weaken the change of a peripheral morphology caused by a conductive plug and the influence of an electric field of the conductive plug on signal transmission of a peripheral component.

In order to solve the abovementioned problem, some embodiments of the disclosure provide a semiconductor structure, including a substrate and a dielectric layer arranged on the substrate, a conductive plug and an isolation ring structure. A first part of the conductive plug is arranged in the substrate, and a second part of the conductive plug is arranged in the dielectric layer. The isolation ring structure at least surrounds the second part of the conductive plug.

BRIEF DESCRIPTION OF THE DRAWINGS

One or more embodiments are illustrated through corresponding figures in the drawings, which do not constitute limitations on the embodiments. The elements with the same reference numeral in the drawings are similar elements. Unless otherwise stated, the figures in the drawings do not constitute proportional limitations.

DETAILED DESCRIPTION

Figure 1:
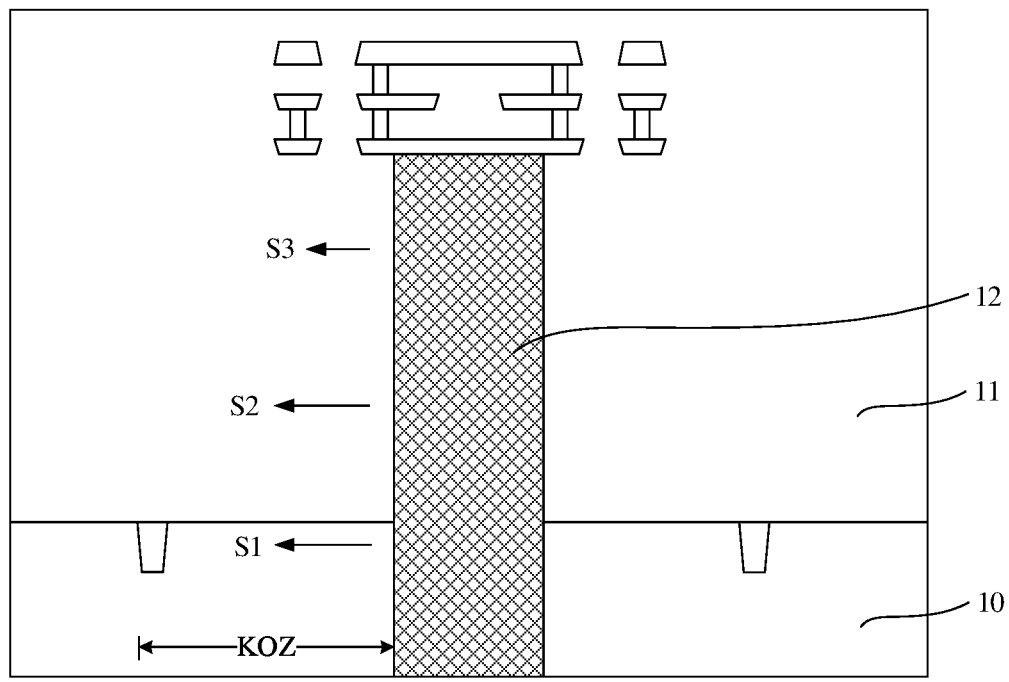
FIG. 1 is a schematic sectional diagram of a semiconductor structure.

Referring to FIG. 1, which is a schematic sectional diagram of a semiconductor structure. The semiconductor structure includes a substrate 10 and a dielectric layer 11 arranged on the substrate 10, and a conductive plug 12 arranged in the substrate 10 and the dielectric layer 11.

The conductive plug 12 usually includes metal materials, which easily expand and shrink when being subjected to a thermal stress action. When a thermal expansion coefficient of the conductive plug 12 is different from a thermal expansion coefficient of the dielectric layer 11 and the substrate 10, a stress concentration phenomenon will occur, which causes the deformation of the substrate 10 and the dielectric layer 11. In addition, the expanded/shrunk conductive plug 12 applies compressive stress to a silicon substrate material in the substrate 10 and the dielectric layer 11 surrounding the conductive plug 12, which causes the deformation of the substrate 10 and the dielectric layer 11. The deformation of the substrate 10 and the dielectric layer 11 may cause influence on properties of the functional elements in the element region, and may even cause a structural damage of the semiconductor structure.

The element region is a working region of the functional elements and includes an interior of the substrate 10, a surface of the substrate 10 and an interior of the dielectric layer 11.

When the conductive plug 12 expands and applies the compressive stress to the substrate 10, a boundary region of the substrate 10 close to or away from the dielectric layer 11 will bear greater deformation force, and a middle region of the substrate 10 will bear smaller deformation force. Similarly, a boundary region of the dielectric layer 11 close to the substrate 10 will bear greater deformation force, and the compressive stress born by the dielectric layer 11 is gradually reduced in a direction away from the substrate 10. That is, a first compressive stress S1 is greater than a second compressive stress S2, and the second compressive stress S2 is greater than a third compressive stress S3.

It should be noted that the stress causing the deformation of the substrate 10 and the dielectric layer 11 may come from a secondary stress generated by the deformation of other adjacent film layer except the direct stress of the conductive plug 12. For example, the substrate 10 deforms through the compressive stress of the conductive plug 12, and the deformed substrate 10 applies stress to the dielectric layer 11 due to a changed structure, which in turn causes the deformation of the dielectric layer 11.

A method for solving or preventing the deformation of the substrate 10 and the dielectric layer 11 is not available at present. In order to avoid the influence of the deformation of the substrate 10 and the dielectric layer 11 on the functional elements in the element region, the functional elements are usually arranged outside a keep out zone (KOZ), that is, the functional elements are away from the conductive plug 12. This solution enables a reserved region of the functional elements to be greatly compressed, which is not beneficial to integrate the chips or functional elements.

In order to solve the abovementioned problem, embodiments of the disclosure provide a semiconductor structure. An isolation ring structure surrounding the conductive plug is arranged to isolate the delivery of the deformation of the dielectric layer, prevent the deformation from extending to the element region, and ensure that functional elements in the element region can normally work.

In order to make the objectives, technical solution and advantages of embodiments of the disclosure clearer, the embodiments of the disclosure will be described in detail below in conjunction with the drawings. However, those of ordinary skill in the art may understand that, in various embodiments of the disclosure, various technical details are provided for readers to understand the disclosure better. However, even without these technical details as well as various changes and modifications based on the embodiments below, the technical solution protected by the disclosure may also be implemented.

Figure 2:
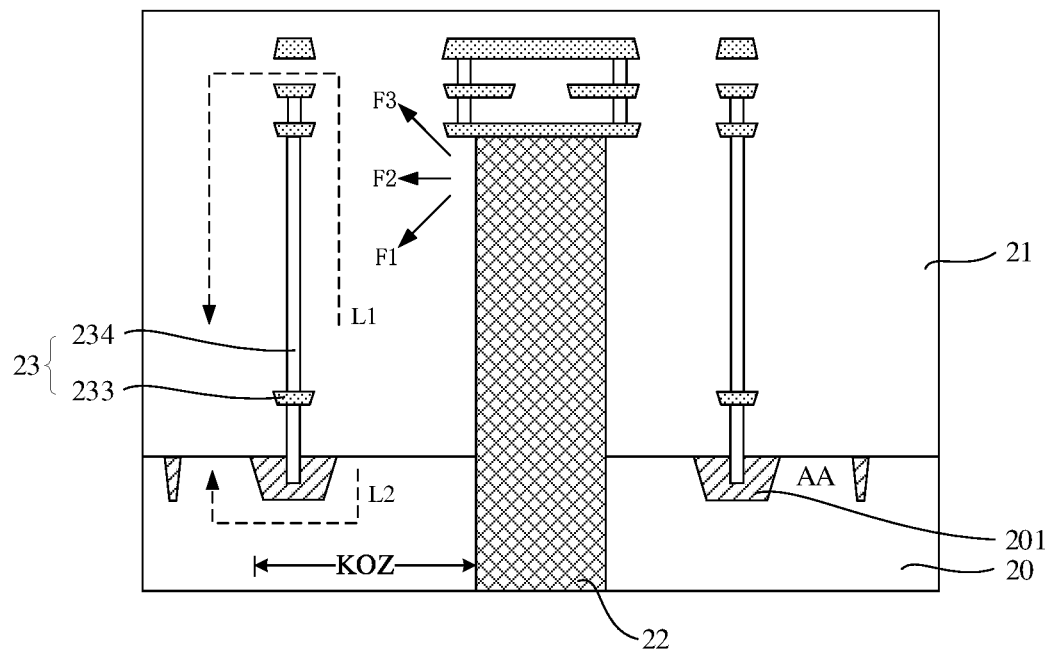
FIG. 2 to FIG. 8 are schematic diagrams of a semiconductor structure according to embodiments of the disclosure.

Referring to FIG. 2, which is a schematic sectional diagram of a semiconductor structure according to embodiments of the disclosure.

The semiconductor structure provided in FIG. 2 includes a substrate 20 and a dielectric layer 21 arranged on the substrate 20, a conductive plug 22 and an isolation ring structure 23. A first part of the conductive plug 22 is arranged in the substrate 20, and a second part of the conductive plug 22 is arranged in the dielectric layer 21. The isolation ring structure 23 at least surrounds the second part of the conductive plug 22.

In this embodiment, the isolation ring structure 23 surrounding the conductive plug 22 is arranged to isolate the delivery of the deformation of the dielectric layer 21, prevent the deformation from extending to the element region, and ensure that functional elements in the element region can normally work. The principle of the isolation ring structure 23 to isolate the deformation is as follows.

Since the deformation force will loss a great number of energy when penetrating through the boundary, the deformation force always tends to deliver on a path with the fewest boundary quantity. The isolation ring structure 23 surrounding the conductive plug 22 is arranged to extend a first delivery path L1 for the deformation force in partial regions in the dielectric layer 21, so that the greater deformation force is continuously consumed in the delivery path, and the smaller deformation force after final consumption or originally smaller deformation force can be delivered to the element region, thereby avoiding the influence of greater deformation force on the functional elements in the element region and ensuring that the functional elements in the element region have better performance.

In this embodiment, the material of the isolation ring structure 23 is a conductive material. Thus, the isolation ring structure 23 may constitute a conductor cavity with an electromagnetic shielding effect, thereby avoiding the influence of the electric field of the conductive plug 22 in the conductor cavity on the functional elements outside the conductor cavity, so that the functional elements, away from a side of the conductive plug 22, of the isolation ring structure 23 can effectively run.

The electromagnetic shielding effect of the isolation ring structure 23 is associated with a height difference between a height of a top surface of the isolation ring structure 23 and a height of a top surface of the conductive plug 22. The greater the height difference, the better the electromagnetic shielding effect of the isolation ring structure 23. Specifically, the electric field direction of the conductive plug 22 may be divided into three directions: a first electric field direction F towards the substrate 20, a second electric field direction F2 parallel to the surface of the substrate 20, and a third electric field direction F3 away from the substrate 20. When the top surface of the isolation ring structure 23 is flush with the top surface of the conductive plug 22, the isolation ring structure only shields the electric fields in the first electric field direction F1 and the second electric field direction F2 and does not shield the electric field in the third electric field direction F3. When the top surface of the isolation ring structure 23 is higher than the top surface of the conductive plug 22, the isolation ring structure 23 can shield a part of the electric field in the third electric field direction F3.

In this embodiment, the top surface of the second part of the conductive plug 22 is lower than or flush with the top surface of the isolation ring structure 23 in a direction perpendicular to the surface of the substrate 20. Thus, the deformation force delivered to the element region is ensured to be less, the influence of the deformation force on the properties of the functional elements is avoided, and the functional elements in a greater region are not affected by the electric field of the conductive plug 22, that is, the functional elements have greater reserved space.

The height difference between the top surface of the second part of conductive plug 22 and the top surface of the isolation ring structure 23 is associated with the distance between the isolation ring structure 23 and the conductive plug 22. For the delivery of the deformation force, the farther the isolation ring structure 23 is from the conductive plug 22, the longer the first delivery path L1, the greater the consumption of the deformation force on the first delivery path L1, the shorter the delivery path that needs to be extended by the isolation ring structure 23, and the smaller the height difference. For the influence of the electric field, the closer the isolation ring structure 23 is to the conductive plug 22, the greater the scope of electric field that can be shielded by the isolation ring structure 23, and the smaller the height difference, in a case that the height of the top surface of the second part of the conductive plug 22 and the height of the top surface of the isolation ring structure 23 are constant. In addition, the higher the functional elements in the dielectric layer 21, the greater the scope (reserved space for the functional elements) that needs to be shielded by the isolation ring structure 23, and the greater the height difference.

In this embodiment, the isolation ring structure 23 is arranged in the substrate 20. Thus, the substrate 20 can perform a function of fixing the isolation ring structure 23, which is beneficial to prevent the displacement of the isolation ring structure 23 caused by the deformation of the dielectric layer 21, and in turn to prevent the displacement of the isolation ring structure 23 from causing a damage and even a structural destroy of the elements in the element region. In addition, the isolation ring structure 23 is partially arranged in the substrate 20, so as to prolong a second delivery path L1 of the deformation in the substrate 20 and strengthen an isolation effect of the isolation ring structure 23.

It should be understood that, in addition to the influence of the deformation of the dielectric layer 21, the properties of the elements in the element region is also affected by the deformation of the substrate 20. The deformation force of the substrate 20 mainly comes from the compressive stress applied to a boundary region of the substrate 20 close to the dielectric layer 21 by the conductive plug 22 and the compressive stress of the dielectric layer 21. The isolation ring structure 23 is arranged in the substrate 20, which is beneficial to prolong the length of the second delivery path L2, increase the energy loss of the deformation force during the delivery, and ensure that the functional elements in the element region are subjected to a small deformation force, so that the elements have better performance.

In addition, the isolation ring structure 23 is arranged in the substrate 20, which can further enlarge the electromagnetic shielding scope of the isolation ring structure 23, further shield the electric field formed by the conductive plug 22 arranged in the substrate 20, avoid the influence of this electric field on the properties of the functional elements in the element region and ensure that the functional elements have better properties during the running.

In this embodiment, the substrate 20 includes isolation structures 201 and an active region AA between adjacent isolation structures 201. The isolation structures 201 not only achieves the effect of defining the active region AA, but also is configured to prevent the deformation from delivering and prolong the delivery path. In one example, the depth of the isolation ring structure 23 in the substrate 20 is equal to the depth of the isolation structures 201 in the substrate in a direction perpendicular to the substrate 20. Thus, the ability of the isolation ring structure 23 preventing the deformation of the substrate 20 is increased, and the area of the KOZ is further reduced.

In this embodiment, the isolation ring structure 23 is also arranged in the isolation structures 201. Thus, the deformation of the isolation ring structure 23 arranged in the substrate 20 is limited in the isolation structures 201, and the influence of the isolation ring structure 23 on the properties of the active region AA and the properties of the functional elements in the element region is avoided. In another embodiment, the isolation ring structure is also arranged in the active region. The area of the active region is usually greater than the area of the isolation structure, so that the bottom of the isolation ring structure is arranged in the active region, which is beneficial to add the position flexibility of the isolation ring structure. The KOZ may be maximally reduced, which is not limited by the position of the isolation structure.

Figure 3:
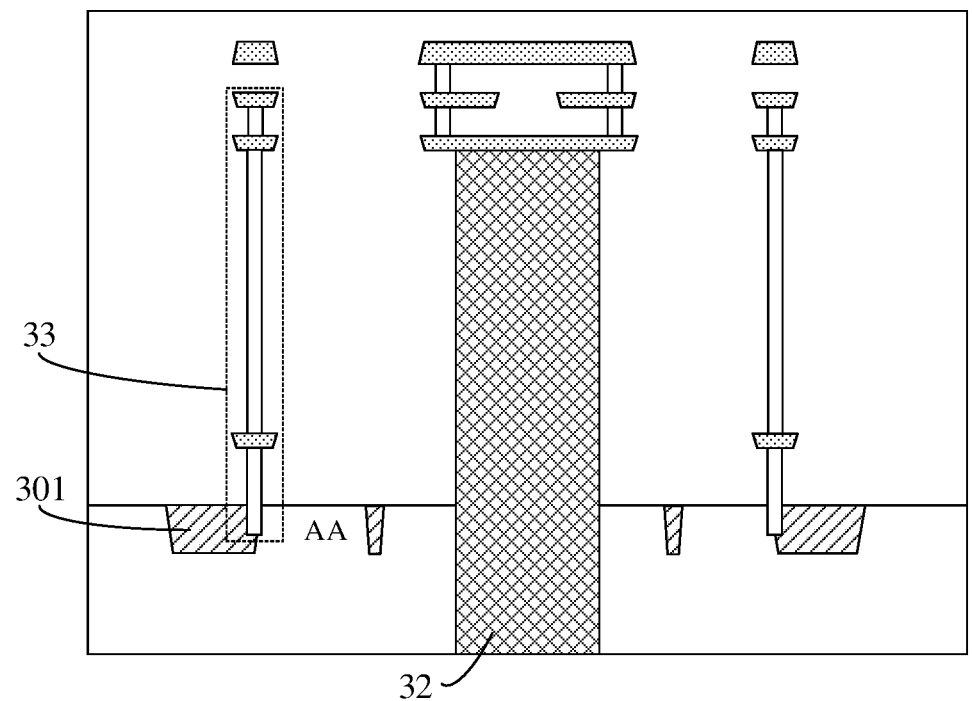
Figure 4:
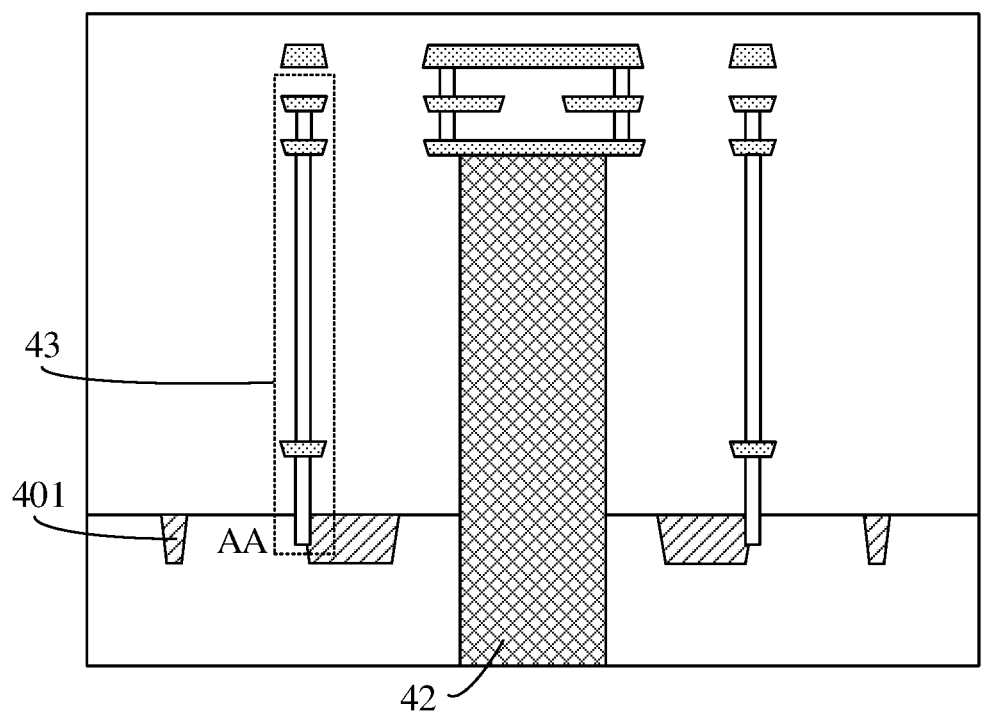

In addition, in another embodiment, the isolation ring structure may also be arranged in the active region and the isolation structures. This situation includes two following possibilities. Referring to FIG. 3, the part close to the conductive plug 32 is arranged in the active region AA, and the other part away from the conductive plug 32 is arranged in the isolation structure 301. Thus, the isolation structure 301 may absorb a part of the deformation force when the isolation ring structure 33 deforms in a direction away from the conductive plug 32, to prevent the greater deformation force from affecting the properties of the functional elements in the element region. Or, referring to FIG. 4, the part away from the conductive plug 42 is arranged in the active region AA, and the other part close to the conductive plug 42 is arranged in the isolation structure 401. Thus, the isolation structure 301 may absorb a part of the deformation force when the isolation ring structure 33 deforms in a direction away from the conductive plug 32, to prevent the greater deformation force from affecting the properties of the functional elements in the element region.

In an actual application, the positional relationship between the isolation ring structure 23 and the isolation structure 201 may be determined according to an application environment. In addition, the isolation ring structure 23 may deform, which may cause influence on the properties of the functional elements. Therefore, the distance between the boundary of the KOZ and the conductive plug 22 is usually greater than the distance between the isolation ring structure 23 and the conductive plug 22, and the boundary of the KOZ may be defined by the isolation structure 201 in the substrate 20. When the isolation ring structure 23 does not deform towards the element region, the boundary of the KOZ may be defined by the isolation ring structure 23. That is to say, when the isolation ring structure 23 does not deform, the edge of the KOZ away from the conductive plug 22 is flush with the edge of the isolation ring structure 23 away from the conductive plug 22, thereby reducing the area of the KOZ and improving the space utilization rate of the semiconductor structure.

Figure 5:
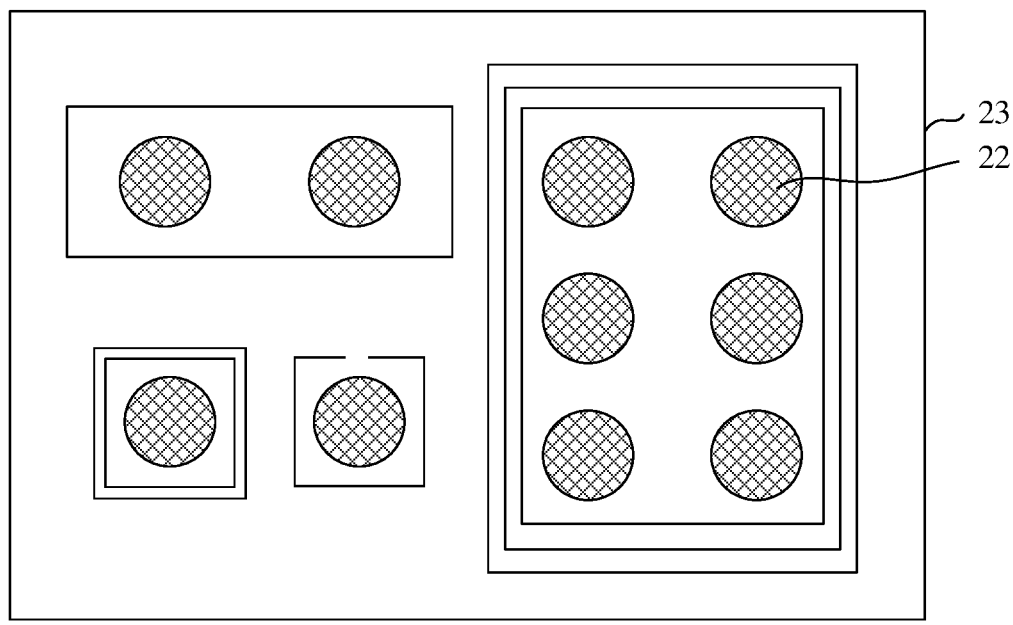

In this embodiment, referring to FIG. 5, the isolation ring structure 23 may surround one or more conductive plugs 22. Thus, the isolation efficiency of the isolation ring structure 23 is improved, the number of the isolation ring structure 23 to be arranged is reduced, and the cost of the semiconductor structure is reduced.

Figure 6:
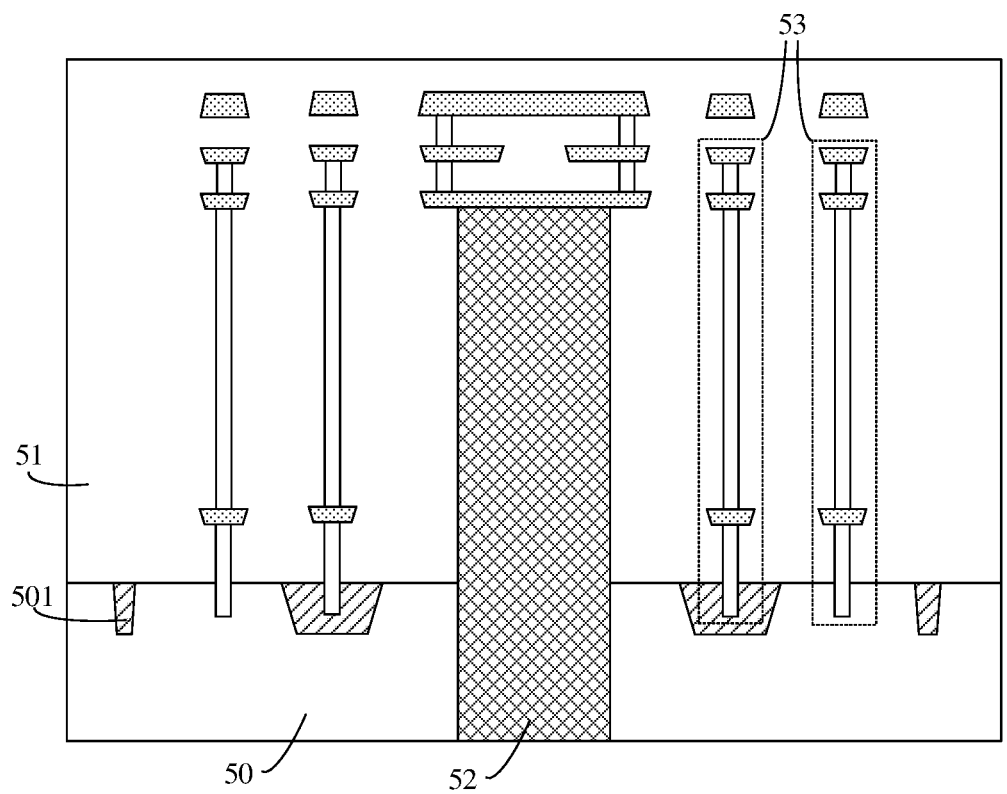

In other embodiment, referring to FIG. 6, the isolation ring structure 53 may include a plurality of separate isolation rings, and at least two isolation rings surround the same conductive plug 52.

In an actual application of the isolation ring structure 53, considering the space utilization rate of the dielectric layer 51, the isolation rings are usually not arranged at a place far away from the conductive plug 52, so that a single isolation ring cannot usually and effectively isolate the deformation force and shield the electric field. The specific reasons are as follows.

On the one hand, the position closer to the conductive plug 52 has greater deformation. In this case, a part of the deformation force will be continuously delivered after acting on the isolation ring structure 53 and penetrating through the isolation ring structure 53.

On the other hand, the isolation ring structure 53 provided by the disclosure may be either a closed film layer or a non-closed film layer, such as a net structure. The electrostatic shielding effect of the closed film layer is better than that of the non-closed film layer. When the isolation ring structure 53 is the non-closed film layer, the position closer to the conductive plug 52 has greater electric field intensity, a part of the electric field still causes influence on the properties of the functional elements after penetrating through the isolation ring structure 53.

In this embodiment, a plurality of isolation rings surrounds the same conductive plug 52, which is beneficial to improve the isolation effect of the single conductive plug 52, further prevents the peripheral morphology change caused by the conductive plug 52 or prevents the electric field of the conductive plug 52 from affecting the properties of the functional elements in the element region, and ensures that the semiconductor structure has better performance. Furthermore, the plurality of isolation rings are adopted to surround the same conductive plug, so as to shorten the maximum distance between the isolation ring structure 53 and the conductive plug 52, namely, shorten the scope of the KOZ and enlarge the reserved space for the functional elements.

It should be noted that the characteristic parameters of the adjacent isolation rings may be the same or different. The characteristic parameters include, but are not limited to: a height difference between the top surface of the isolation ring and the top surface of the conductive plug 52, a positional relationship between the isolation ring and a groove structure 501, thickness of the isolation ring in the substrate 50 and self-material, etc.

In this embodiment, the isolation ring structure 23 includes at least two conductive pillars 234 successively arranged in a direction perpendicular to the substrate 20 and conductive layers 233 each arranged between the adjacent conductive pillars 234. In another embodiment, the isolation ring structure only includes one conductive pillar extending in a direction perpendicular to the substrate.

Figure 7:
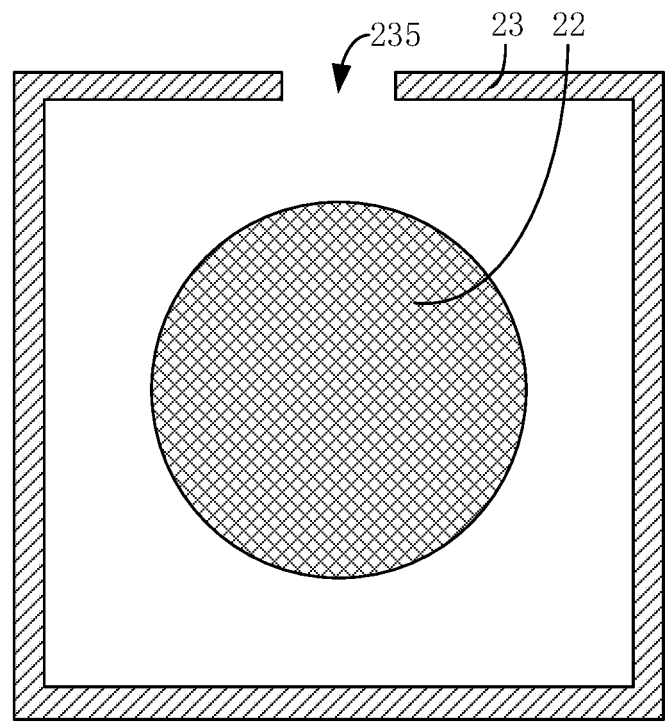

In this embodiment, referring to FIG. 7, the isolation ring structure 23 is provided with at least one notch 235 in a surrounding direction, and the total length of the notch 235 is less than or equal to 10% of the total perimeter of the isolation ring structure 23 in the surrounding direction. Thus, the isolation effect of the isolation ring structure 23 can be ensured while reserving the notch.

Herein, the notch may exist due to the presence of non-movable functional devices in the dielectric layer 21 or self needs of the semiconductor structure.

In this embodiment, the thickness of the isolation ring structure 23 in a direction perpendicular to the surface of the substrate 20 is comprised between 1.5 microns and 15 microns, for example, 4 microns, 8 microns or 12 microns. The isolation ring structure 23 in this scope of the thickness value can ensure the electric shielding and stress isolation to the functional elements in the element region and ensure smaller deformation force diffused to the element region, which will not affect the functional elements in the element region.

Figure 8:
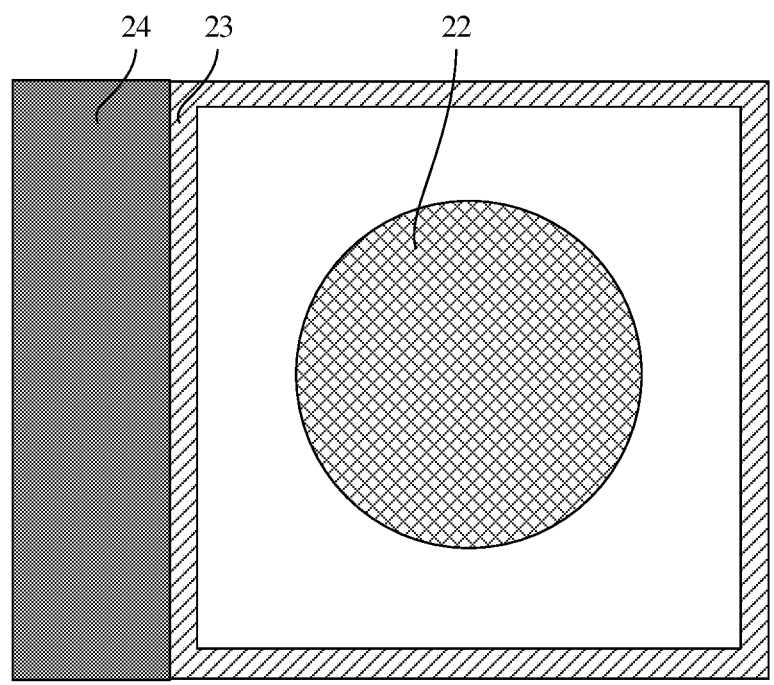

In this embodiment, referring to FIG. 8, the semiconductor structure further includes an element region 24 located at one side of the isolation ring structure 23 away from the conductive plug 22. The distance (namely, the distance between the edge of the KOZ away from the conductive plug 22 and the conductive plug 22) between the element region 24 and the conductive plug 22 in a direction of the element region 24 facing toward the conductive plug 22 is comprised between 2 microns and 20 microns, for example, 4 microns, 10 microns or 16 microns. Thus, a greater reserved space for the element region is ensured, and the upper limit of the element integration in the element region 24 is improved, which in turn improve the integration of the chip.

In this embodiment, the isolation ring structure surrounding the conductive plug is arranged to isolate the delivery of the deformation of the dielectric layer, prevent the deformation from extending to the element region located at one side of the isolation ring structure away from the conductive plug, and ensure that functional elements in the element region can normally work.

Those of ordinary skill in the art may understand that the abovementioned embodiments are specific embodiments for realizing the disclosure. However, in actual application, various changes may be made to the forms and details without deviating from the spirit and scope of the disclosure. Those skilled in any art may make respective change and modification without deviating from the spirit and scope of the disclosure, therefore, the protection scope of the disclosure shall be subjected the scope defined in claims.

The invention claimed is:

1. A semiconductor structure, comprising:
   a substrate and a dielectric layer arranged on the substrate;
   a conductive plug, a first part of the conductive plug being arranged in the substrate, and a second part of the conductive plug being arranged in the dielectric layer;
   an isolation ring structure arranged in the substrate and in the dielectric layer, wherein the isolation ring structure surrounds the first part and the second part of the conductive plug; and
   functional elements, wherein the functional elements are arranged outside a region enclosed by the isolation ring structure and are absent inside the region enclosed by the isolation ring structure,
   wherein the isolation ring structure comprises at least one conductive pillar extending in a direction perpendicular to a surface of the substrate,
   wherein the substrate comprises isolation structures, the at least one conductive pillar is arranged in the substrate, and a depth of the at least one conductive pillar in the substrate is equal to a depth of each of the isolation structures in the substrate.

2. The semiconductor structure of claim 1, wherein a top surface of the second part of the conductive plug is lower than or flush with a top surface of the isolation ring structure in the direction perpendicular to the surface of the substrate.

3. The semiconductor structure of claim 1, wherein the substrate comprises an active region, and the isolation ring structure is arranged in the active region.

4. The semiconductor structure of claim 1, wherein the substrate comprises an active region between adjacent isolation structures, the isolation ring structure is arranged in the isolation structures, or the isolation ring structure is arranged in the active region and the isolation structures.

5. The semiconductor structure of claim 1, wherein the isolation ring structure surrounds a plurality of conductive plugs.

6. The semiconductor structure of claim 5, wherein the isolation ring structure comprises a plurality of separate isolation rings, at least two isolation rings of the plurality of separate isolation rings surround a same conductive plug, one of the at least two isolation rings encloses the same conductive plug, and another one of the at least two isolation rings encloses the one of the at least two isolation rings and the same conductive plug.

7. The semiconductor structure of claim 1, wherein the isolation ring structure comprises a plurality of separate isolation rings, at least two isolation rings of the plurality of separate isolation rings surround a same conductive plug, one of the at least two isolation rings encloses the same conductive plug, and another one of the at least two isolation rings encloses the one of the at least two isolation rings and the same conductive plug.

8. The semiconductor structure of claim 1, wherein the isolation ring structure comprises at least two conductive pillars successively arranged in the direction perpendicular to the surface of the substrate and conductive layers each arranged between adjacent conductive pillars of the at least two conductive pillars.

9. The semiconductor structure of claim 1, wherein the isolation ring structure is provided with at least one notch in a surrounding direction, and a total length of the at least one notch is less than or equal to 10% of a total perimeter of the isolation ring structure in the surrounding direction.

10. The semiconductor structure of claim 1, wherein a thickness of the isolation ring structure in the direction perpendicular to the surface of the substrate is between 1.5 microns and 15 microns.

11. The semiconductor structure of claim 1, further comprising a keep out zone between the isolation ring structure and the conductive plug, wherein an edge of the keep out zone away from the conductive plug is flush with an edge of the isolation ring structure away from the conductive plug in the direction perpendicular to the surface of the substrate.

12. The semiconductor structure of claim 11, wherein a distance between the edge of the keep out zone away from the conductive plug and the conductive plug in a direction of the keep out zone away from the conductive plug is between 2 microns and 20 microns.

* * * * *